(12) United States Patent
Liu et al.

(10) Patent No.: US 6,314,132 B1
(45) Date of Patent: Nov. 6, 2001

(54) MICROPROCESSOR STRUCTURE AND METHOD FOR IMPLEMENTING DIGITAL FILTER OPERATIONS

(75) Inventors: Te-Chung Liu, Hsinchu Hsien; Hwan-Rei Lee; Daniel Shih, both of Hsinchu, all of (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 09/460,397

(22) Filed: Dec. 13, 1999

(51) Int. Cl.[7] .................................................. H03H 7/30
(52) U.S. Cl. ............................................................ 375/229
(58) Field of Search .................................... 375/229, 230, 375/232; 333/18, 28 R; 708/300, 301, 305, 322, 323

(56) References Cited

U.S. PATENT DOCUMENTS 3,573,624 * 4/1971 Hartmann ............................ 375/230
4,386,430 * 5/1983 Treiber .................................. 375/232
5,461,641 * 10/1995 Abbiate et al. ....................... 375/243

* cited by examiner

Primary Examiner—Tesfaldet Bocure
(74) Attorney, Agent, or Firm—Bacon & Thomas

(57) ABSTRACT

A microprocessor structure and a method for implementing digital filter operations are disclosed, which utilize an increment/decrement unit, and an accumulator unit and a register set which are already existing in a microprocessor, to provide finite impulse response digital filter and inner product operations. With the increment/decrement unit, when a finite impulse response digital filter operation is executed, it is able to automatically move the data into a memory, so that when a next operation is executed, it is able to immediately perform the operation simply by writing new data and setting pointers, whereby the microprocessor can efficiently perform the operations of digital signal processing.

12 Claims, 3 Drawing Sheets

MICROPROCESSOR STRUCTURE AND METHOD FOR IMPLEMENTING DIGITAL FILTER OPERATIONS

BACKGROUND OF THE INVENTION

1. Field of the Invention

The present invention relates to the field of digital signal processing and, more particularly, to a microprocessor structure and a method for implementing digital filter operations.

2. Description of Related Art

The finite impulse response filter (FIR) and inner product are known as the fundamental operation blocks of a digital signal processor (DSP). The FIR operation is provided to process the following equation:

$$y_n = \sum_{i=0}^{N-1} c_i x_{n-i},$$

wherein, N is the order of a filter, $x_n$ is the nth input, $y_n$ is the nth output, $c_i$ (i=0 ... N−1) is the constant coefficient of the filter. Taking N=4 as an example, we have:

$$y_n = c_0 x_n + c_1 x_{n-1} + c_2 x_{n-2} + c_3 x_{n-3},$$

while the operation of the next data is:

$$y_{n-1} = c_0 x_{n+1} + c_1 x_n + c_2 x_{n-1} + c_3 x_{n-2}.$$

To perform proper operations on each input value in a conventional digital signal processor, the oldest data is overwritten by the next data, and the pointers of the DSP will be moved to the newest data. The positions of the pointers are automatically calculated during the operation. Referring to FIG. 3A, before performing an operation to a first value, the arrangement of the memory is of ... $c_0$, $c_1$, $c_3$, $x_n$, $x_{n-1}$, $x_{n-2}$, $x_n$ ..., wherein pointer R1 and pointer R2 are respectively pointed to $C_O$ and $x_n$. Referring to FIG. 3B, before the next operation is performed, the $X_{n+1}$, is overwritten by the $x_{n+1}$, and the pointer R2 is pointed to $x_{n+1}$. When performing the required multiplication operations for N times to each value, an additional address generator 31 is provided to generate a new pointer Rn to perform the multiplication/addition operation for each time. Such operation is performed by the following equation:

$$R2 = (R2 - \text{Base} + i)\% \, N + \text{Base},$$

wherein, N=4, i=0 ... N−1, "Base" is a base address in which the x is stored, and R2 is the address of a first data being processed by the current operation.

Accordingly, it is known that the conventional digital signal processor must be provided with additional hardware to perform the operation of updating the content of the pointer for carrying out a multiplication operation during each operation cycle. While performing such operation, three addition/subtraction operations and one modulo operation must be executed, which result in a relatively high hardware cost. Moreover, a microprocessor usually does not have a hardware multiplier so it cannot efficiently provide the operation functions of such kind of digital signal processing. Therefore, considering the hardware cost, there is a need to have a microprocessor which can efficiently implement digital filter operations.

BRIEF SUMMARY OF THE INVENTION

One object of the present invention is to provide a microprocessor structure with simple hardware resources for implementing digital filter as well as inner product operations.

Another aspect of the present invention is to provide a method for implementing digital filter operations by means of a microprocessor to effectively accomplish the digital filter operations.

In accordance with one aspect of the present invention, there is provided a microprocessor structure for implementing digital filter operations performed on a memory sequentially storing multiple digital filter coefficients and input values to be filtered. The microprocessor structure includes: a register set including a first register having a value pointed to a digital filter coefficient of the memory, and a second register having a value pointed to an input value of the memory; an accumulator circuit for reading the digital filter coefficient pointed by the value of the first register and the input value pointed by the value of the second register, the accumulator circuit multiplying the digital filter coefficient by the input value using an arithmetic logic unit to obtain a product, and the product being accumulated; and, an increment/decrement unit for performing increment/decrement operations to the first register and the second register. By such an arrangement, when the accumulator circuit performs an accumulation operation, the input value read by the accumulator circuit is temporarily stored, and the increment/decrement unit respectively increases/decreases the values of the first register and the second register and the values are stored back to the first register and the second register. The accumulator circuit takes the increased/decreased values in the first register and the second register as addresses to respectively read a digital filter coefficient and an input value from the memory, and takes the increased/decreased values in the second register as an address to write the temporarily stored input value into the memory, and then proceeding a next operation.

In accordance with another aspect of the present invention, there is provided a method for implementing digital filter operations performed on a memory by using a microprocessor. The memory sequentially stores multiple digital filter coefficients and input values to be filtered. The method includes the steps of: (A) reading a digital filter coefficient and an input value; (B) performing a multiplication operation to said digital filter coefficient and said input value to obtain a product, said product being accumulated; (C) retaining said input value; (D) reading a next digital filter coefficient and a next input value; and (E) moving the retained input value to a memory location provided for storing the next input value, and returning to step (B) to repeatedly execute the steps until the product of a last digital filter coefficient and a last input value is accumulated.

Further benefits and advantages of the present invention will become apparent after a careful reading of the detailed description with appropriate reference to the accompanying drawings.

DETAILED DESCRIPTION OF THE INVENTION

Figure 1A:
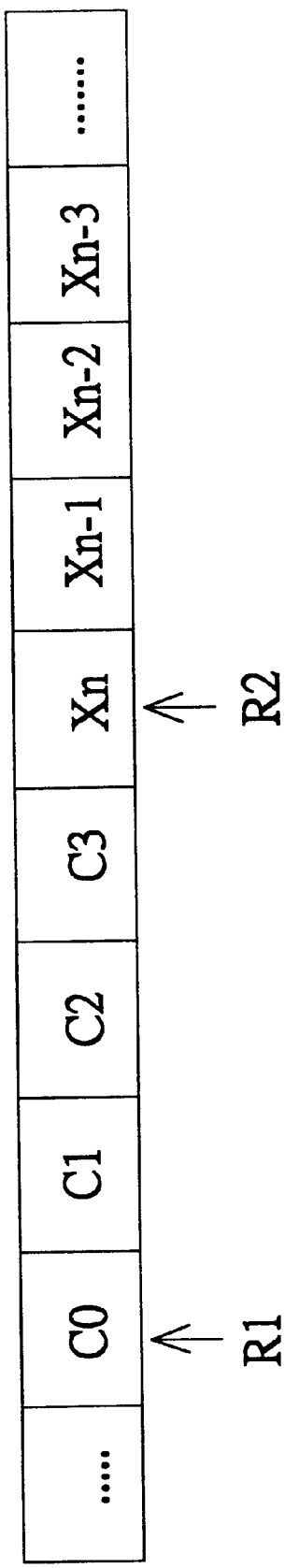
FIGS. 1A and 1B show the arrangements of data in a memory for being processed by the microprocessor structure and method for implementing digital filter operations in accordance with the present invention.
Figure 1B:
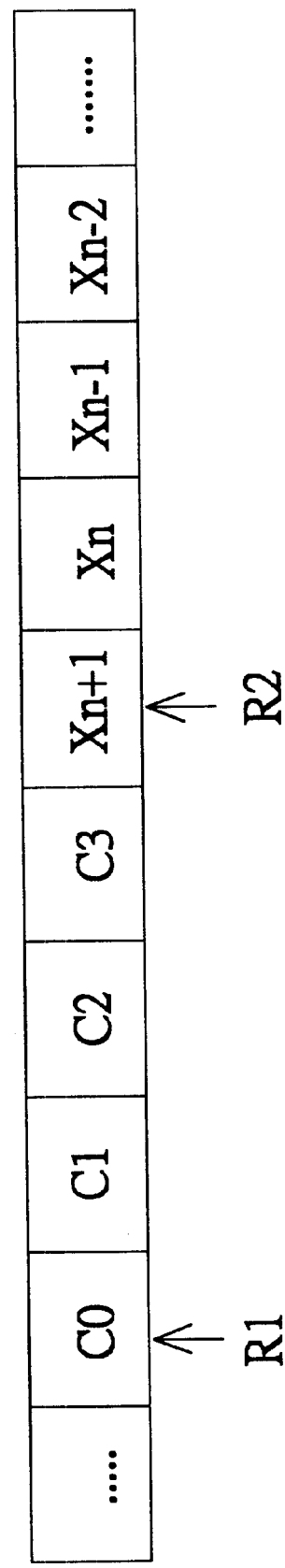

Referring to the drawings and initially to FIGS. 1A and 1B, a method in accordance with the present invention is used for implementing digital filter operations by means of a microprocessor structure. FIGS. 1A and 1B show the arrangements of data in a memory for proceeding the operation. Before performing the operation to a first data, the arrangement of the memory is of . . . $c_0, c_1, c_2, c_3, x_n, x_{n-1}, x_{n-2}, x_{n-3}$ . . . , as shown in FIG. 1A, wherein pointer R1 and pointer R2 are respectively pointed to $c_0$ and $x_n$. When the operation is performed on the next data, the arrangement of the memory is of . . . $c_0, c_1, c_2, c_3, x_{n+1}, x_n, x_{n-1}, x_{n-2}$ . . . , as shown in FIG. 1B, wherein pointer R1 and pointer R2 are respectively pointed to $c_0$ and $x_{n+1}$. Therefore, it is able to perform the operation on each data in the same manner such that complicated processing to move the pointers R1 and R2 can be eliminated and the digital filter operation can be implemented by using a microprocessor structure.

Figure 2:
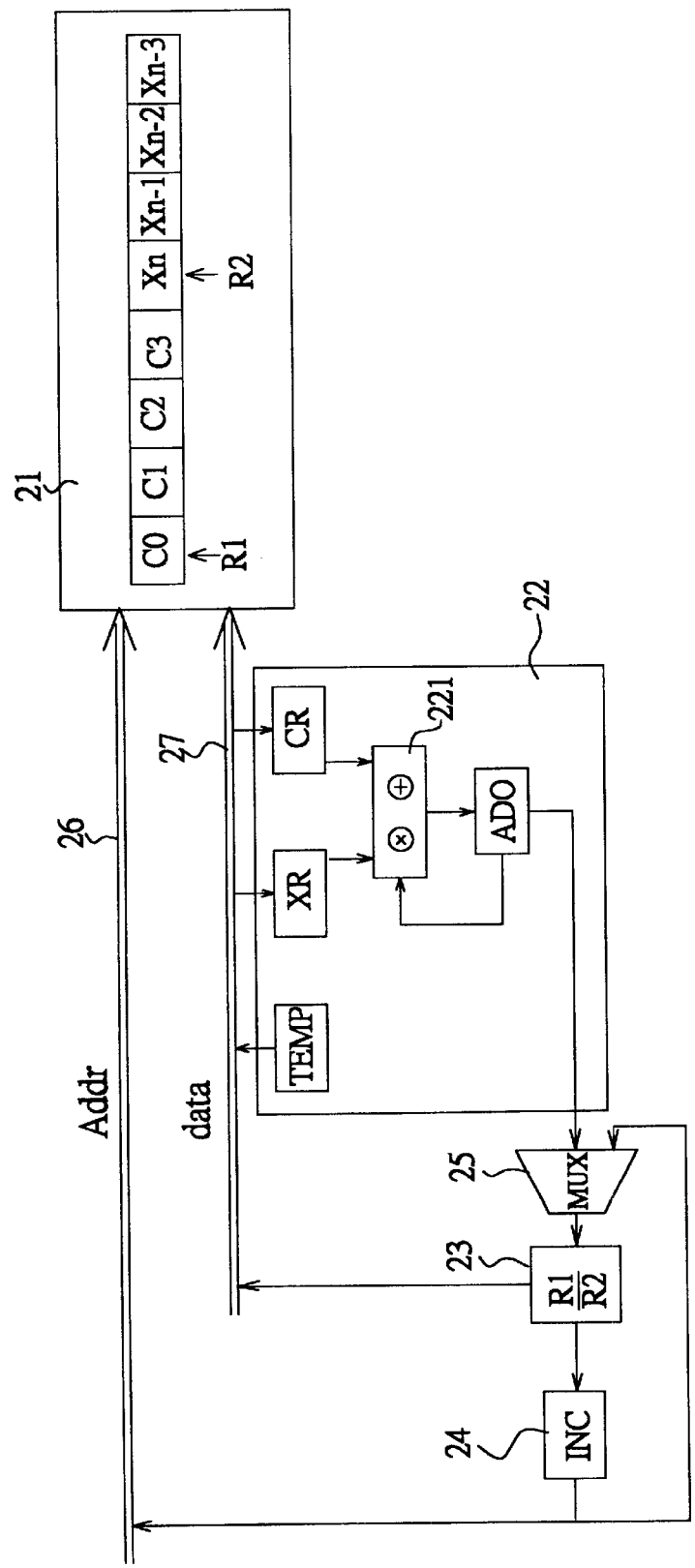
FIG. 2 is a system block view of the microprocessor structure in accordance with the present invention.
Figure 3A:
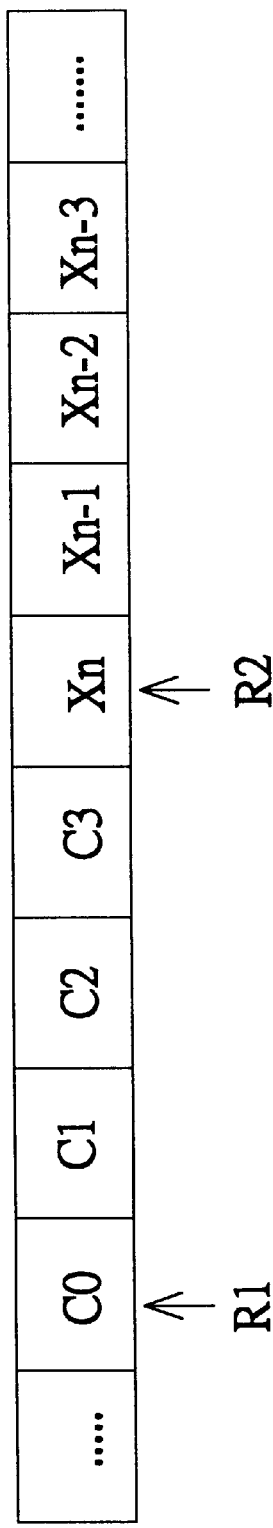
FIGS. 3A and 3B show the arrangements of data in a memory for being processed by a conventional digital signal processor to perform digital filter operations.
Figure 3B:
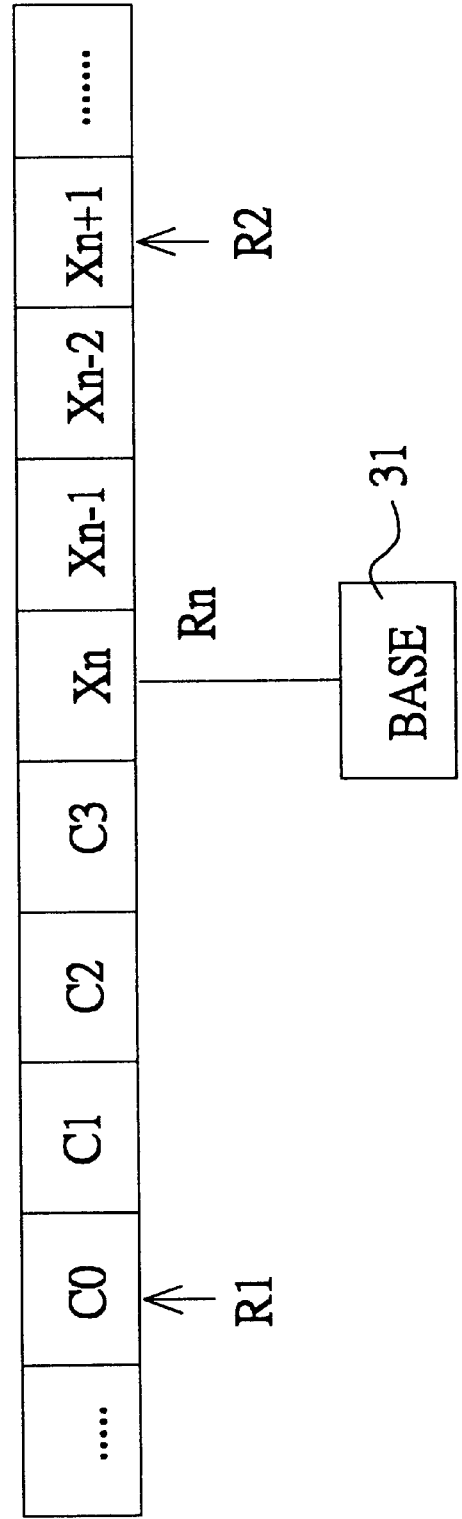

Referring to FIG. 2, a preferred embodiment of the microprocessor structure in accordance with the present invention is provided for implementing a finite impulse response digital filter operation performed on a memory 21 having multiple memory locations for sequentially storing multiple digital filter coefficients $c_i$ and input values $x_i$ to be filtered. The microprocessor structure includes an accumulator circuit 22, a register set 23, an increment unit 24, and a multiplexer 25. The register set 23 includes a first register R1 pointed to a digital filter coefficient $c_i$ in the memory 21, and a second register R2 pointed to an input value $x_i$ in the memory 21, thereby being able to access the memory 21.

The accumulator circuit 22 is provided for reading the digital filter coefficient $c_i$ pointed by the first register R1 and the input value $x_i$ pointed by the second register R2. The accumulator circuit 22 has a multiplication/addition operation unit 221 implemented by the arithmetic logic unit (ALU) of the microprocessor to multiply the digital filter coefficient $c_i$ by the input value $x_i$, and to accumulate the resultant product. The accumulator circuit 22 further includes a coefficient register CR, an input register XR, a temporary register TEMP, and an output register ADO for buffering and storing data. The output register ADO is initialized to 0.

The increment unit 24 is provided for performing increment operations to the values of the first register R1 and the second register R2. The multiplexer 25 is used to selectively apply the output from the accumulator circuit 22 and the output from the increment unit 24 to the register set 23.

With the microprocessor structure as described above, the digital filter operation can be performed. In details, the contents of the memory 21 pointed by the first register R1 and the second register R2 are read into the coefficient register CR and the input register XR, respectively, through the address bus 26 and the data bus 27 of the microprocessor, thereby obtaining a digital filter coefficient $c_i$ and an input value $x_i$.

The digital filter coefficient $c_i$ and the input value $xi$ are then multiplied by the multiplication/addition operation unit 221, and the resultant product is accumulated to the output register ADO.

Meanwhile, the value of the input register XR is copied to the temporary register TEMP to be retained.

When the accumulator circuit 22 processes the aforementioned multiplication and accumulation operations, the accumulator circuit 22 also reads data from the memory 21 for the next operation. Such a data pre-fetch is accomplished by taking the value in the first register R1 plus one, which is obtained by applying the value in the first register R1 to the increment unit 24, as an address to read the content of the pointed memory 21 for storing into the coefficient register CR. The value in the first register R1 is automatically increased by 1 with the use of the increment unit 24. On the other hand, The value in the second register R2 plus one, which is obtained by applying the value in the second register R2 to the increment unit 24, is taken as an address to read the content of the pointed memory 21 for storing into the input register XR. The value in the second register R2 is automatically increased by the increment unit 24.

When the accumulator circuit 22 has read from the memory 21 the data required for operation, the value of the temporary register TEMP is stored into the memory 21 pointed by an address taken from the increased value in the second register R2, thereby automatically moving an input value $x_i$ to the next memory location. Then, the process returns to using the accumulator circuit 22 to perform the multiplication and accumulation operations. The process continues to repeat the multiplication and accumulation operations until the product of the last digital filter coefficient c; and the last input value $x_i$ is accumulated to the output register ADO. Accordingly, the finite impulse response digital filter operation is accomplished, and the operation result in the output register ADO is output through the multiplexer 25.

In the above-mentioned microprocessor structure and method for implementing digital filter operations, the required multiplication operations are performed by the arithmetic logic unit of the microprocessor, instead of a hardware multiplier. Preferably, the arithmetic logic unit performs the multiplication operation by means of Booth multiplication algorithm, or other multi-cycle multiplication algorithm.

Accordingly, it is known that the microprocessor structure and the method in accordance with the present invention have accomplished the purpose of using a microprocessor to perform finite impulse response digital filter operations. In the initial operation, the digital filter coefficient $c_i$, which is used as a multiplicand, is automatically moved to the next memory location due to the effect of the increment unit 24. Furthermore, the values of the second register R2 and the first register R1 are automatically increased by the increment unit 24 and re-stored when the arithmetic logic unit is executing a multiplication operation. The increased values in the registers R1 and R2 are used in the next multiplication operation for the same finite impulse response digital filter operation. In the next operation, the previous multiplicand that is held in the arithmetic logic unit can be sent back to the memory 21 via the data bus 27 by taking the current content of the second register R2 as the address. Alternatively, the multiplicand may not be sent back to the memory 21 so that an inner product operation can be provided. Because the data movement does not affect the operation of the arithmetic logic unit, it can be carried out concurrently with the multiplication operation executed in the arithmetic logic unit without requiring any extra timing. Accordingly, the data movement and finite impulse response digital filter operations can be efficiently accomplished simultaneously.

Similarly, when the content of the memory 21 is arranged in a decreasing manner, that is, the direction of arrangement of the digital filter coefficient c; and the input value $x_i$ is opposite to that as shown in FIGS. 1A and 1B, the increment unit 24 can be replaced by a decrement unit and the increment operation is replaced by a decrement operation to achieve the same effect. The microprocessor structure and the method for implementing digital filter operations with such a decreasing-type memory arrangement is analogous to those of the previous embodiment.

Although the present invention has been explained in relation to its preferred embodiment, it is to be understood that many other possible modifications and variations can be made without departing from the spirit and scope of the invention as hereinafter claimed.

What is claimed is:

1. A microprocessor structure for implementing digital filter operations performed on a memory sequentially storing multiple digital filter coefficients and input values to be filtered, said microprocessor structure comprising:

a register set including a first register having a value pointed to a digital filter coefficient of said memory, and a second register having a value pointed to an input value of said memory;

an accumulator circuit for reading the digital filter coefficient pointed by the value of said first register and the input value pointed by the value of said second register, said accumulator circuit multiplying the digital filter coefficient by the input value through the use of an arithmetic logic unit to obtain a product, and said product being accumulated; and an increment unit for performing increment operations to said first register and said second register;

wherein, when said accumulator circuit performs an accumulation operation, the input value read by said accumulator circuit is temporarily stored, said increment unit respectively increasing the values of said first register and said second register and the values being stored back to the first register and said second register, said accumulator circuit taking the increased values in said first register and said second register as addresses to respectively read a digital filter coefficient and an input value from said memory, and taking the increased values in said second register as an address to write said temporarily stored input value into said memory, and then proceeding a next operation.

2. The microprocessor structure as claimed in claim 1, wherein said accumulator circuit includes:

an input register for storing the input value;

a coefficient register for storing the digital filter coefficients;

a temporary register for temporarily storing the input value that has been read into said input register; and a multiplication/addition operation unit to perform a multiplication operation to the values of said input register and said coefficient register using said arithmetic logic unit, the product obtained from said multiplication operation being accumulated to an output register.

3. The microprocessor structure as claimed in claim 2, wherein said multiplication/addition operation unit performs a multiplication operation by means of Booth multiplication algorithm.

4. A microprocessor structure for implementing digital filter operations performed on a memory sequentially storing multiple digital filter coefficients and input values to be filtered, said microprocessor structure comprising:

a register set including a first register having a value pointed to a digital filter coefficient of said memory, and a second register having a value pointed to an input value of said memory;

an accumulator circuit for reading the digital filter coefficient pointed by the value of said first register and the input value pointed by the value of said second register, said accumulator circuit multiplying the digital filter coefficient by the input value using an arithmetic logic unit to obtain a product, and said product being accumulated; and a decrement unit for performing decrement operations to said first register and said second register; wherein, when said accumulator circuit performs an accumulation operation, the input value read by said accumulator circuit is temporarily stored, said decrement unit respectively decreasing the values of said first register and said second register and the values being stored back to the first register and said second register, said accumulator circuit taking the decreased values in said first register and said second register as addresses to respectively read a digital filter coefficient and an input value from said memory, and taking the decreased values in said second register as an address to write said temporarily stored input value into said memory, and then proceeding a next operation.

5. The microprocessor structure as claimed in claim 4, wherein said accumulator circuit includes:

an input register for storing the input value;

a coefficient register for storing the digital filter coefficients;

a temporary register for temporarily storing the input value that has been read into said input register; and a multiplication/addition operation unit to perform a multiplication operation to the values in said input register and said coefficient register using said arithmetic logic unit, the product obtained from said multiplication operation being accumulated to an output register.

6. The microprocessor structure as claimed in claim 5, wherein said multiplication/addition operation unit performs a multiplication operation by means of Booth multiplication algorithm.

7. A method for implementing digital filter operations performed on a memory by using a microprocessor, said memory sequentially storing multiple digital filter coefficients and input values to be filtered, said method comprising the steps of:

(A) providing a first register having a value pointed to a digital filter coefficient of said memory, and a second register having a value point to an input value of said memory;

(B) reading said digital filter coefficient pointed by the value of said first register and said input value pointed by the value of said second register;

(C) performing a multiplication operation to said digital filter coefficient and said input value to obtain a product, said product being accumulated;

(D) retaining said input value;

(E) adjusting the values of said first register and said second register by increment or decrement to point to a next digital filter coefficient and a next input value, respectively;

(F) reading the next digital filter coefficient and the next input value by taking the values of the first and second registers as addresses; and (G) moving the retained input value to a memory location provided for storing the next input value by taking the value of said second register as an address, and returning to step (C) to repeatedly execute the steps until the product of a last digital filter coefficient and a last input value is accumulated.

8. The method as claimed in claim 7, wherein, in step (B), the content of a memory location pointed by said first register is read and stored into a coefficient register, and the content of a memory location pointed by said second register is read and stored into an input register.

9. The method as claimed in claim 8, wherein, in step (C), the value in said coefficient register is multiplied by the value in said input register to obtain a product that is accumulated into an output register.

10. The method as claimed in claim 9, wherein, in said step (D), the value in said input register is stored into a temporary register.

11. The method as claimed in claim 10, wherein, in step (F), the content of a memory location pointed by the value of said first register plus one is read and stored into said coefficient register, while the value in said first register is then increased, and the content of a memory location pointed by the value of said second register plus one is read and stored into said input register, while the value in said second register is then increased.

12. The method as claimed in claim 10, wherein, in step (F), the content of a memory location pointed by the value of said first register minus one is read and stored into said coefficient register, while the value in said first register is then deceased, and the content of a memory location pointed by the value of said second register minus one is read and stored into said input rester while the value in said second register is then deceased.

* * * * *